(12) United States Patent
Yamauchi et al.

(10) Patent No.: US 6,535,033 B2
(45) Date of Patent: Mar. 18, 2003

(54) PEAK HOLD CIRCUIT

(75) Inventors: Toshio Yamauchi; Hironobu Murata, both of Kanagawa; Osamu Hosokawa, Tokyo, all of (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/733,180

(22) Filed: Dec. 7, 2000

(65) Prior Publication Data

US 2002/0070763 A1 Jun. 13, 2002

(51) Int. Cl.[7] .............................................. G11C 27/02
(52) U.S. Cl. ............................................ 327/96; 327/62
(58) Field of Search .............................. 327/58, 59, 62, 327/63, 90, 52, 54, 41, 94–96; 341/122

(56) References Cited

U.S. PATENT DOCUMENTS

| | | | | |
|---|---|---|---|---|
| 5,025,176 A | * | 6/1991 | Takeno | 327/62 |
| 5,430,765 A | * | 7/1995 | Nagahori | 375/318 |
| 5,508,645 A | * | 4/1996 | Castellucci et al. | 327/77 |
| 5,828,240 A | * | 10/1998 | Smith | 327/62 |
| 5,994,928 A | * | 11/1999 | Chevallier | 327/95 |
| 6,064,238 A | | 5/2000 | Wight et al. | 327/58 |
| 6,069,499 A | | 5/2000 | Cho et al. | 327/58 |
| 6,100,829 A | | 8/2000 | Fredrickson et al. | 341/132 |

* cited by examiner

*Primary Examiner*—My-Trang Nuton
(74) *Attorney, Agent, or Firm*—W. Daniel Swayze, Jr.; W. James Brady; Frederick J. Telecky, Jr.

(57) ABSTRACT

A peak detector for detecting a peak signal includes an input circuit for inputting an input signal, a differential comparator for comparing the input signal with the peak signal to generate a difference signal, a diverting circuit to divert current between a first current path and a second current path based on the difference signal, and a comparator to accept current from the first current path and not from the second current path and to form the peak signal resulting from the current.

3 Claims, 4 Drawing Sheets

PEAK HOLD CIRCUIT

FIELD OF THE INVENTION

The present invention relates generally to peak detectors and more particularly to a peak detector for a small input signal.

BACKGROUND OF THE INVENTION

In optical disk applications, peak detectors are used. An AC peak detector is non-linear circuit used to obtain a steady state amplitude at a level of the peak amplitude of the input AC signal. The input AC signal need not be a uniform sinusoidal or an infinite sum of sinusoidals such as in a square wave signal, but any signal with approximately complimentary positive and negative voltage peaks, such as communication date signal, can be an AC signal.

A number of peak detector designs are known, however, each design has shortcomings which limit the range of operability and performance within that range. In particular, there is a need for peak detectors which detect peaks with amplitudes as low as 50 or even 20 millivolts. The known designs do not demonstrate acceptable performance at such levels and more particularly has dead zones where a new peak is not recorded.

FIG. 1 illustrates a prior art circuit where a new peak as an input signal is inputted to op-amp 100 as an input voltage. The op-amp 100 functions as voltage follower, and the op-amp 100 outputs a signal to transistor 102. Current flows through the collector to emitter of the transistor 102, when turned on by the op-amp 100. The transistor 102 conducts current through the collector to emitter and to capacitor 106. The capacitor 106 raises the gate voltage of PFET 108 and the corresponding source of PFET 108 to hold the new peak. The PFET 108 functions as source follower type buffering circuit. When the transistor 102 is off-state, a current source 104 discharges the capacitor 106.

FIG. 2 illustrates simulated waveforms including the input signals and the peak voltages in the prior art circuit. FIG. 2 includes two type input signals and the peak voltages. In FIG. 2, (a) is an input signal having 780 mV peak-to-peak amplitude, (b) is a peak hold voltage of the input signal (a), (c) is an input signal having 100 mV peak-to-peak amplitude, and (d) is a peak hold voltage of the input signal (c). The voltage of the signal (b) is about 91/100(percent) of the top peak voltage of the signal (a), and the voltage of the signal (d) is 68/100(percent) of the top peak voltage of the signal (c). The peak voltage, held by the circuit in FIG. 1, is lower than the peak of the input signal. The difference between the peak hold voltage and the actual peak depends on $V_{BE}$ of the transistor 102.

SUMMARY OF THE INVENTION

The present invention provides a peak detector that includes a differential comparator to compare the current peak with the new peak. The output of the differential comparator is used to control two current paths by two transistors, one current path controls a charging of a capacitor and the new peak voltage.

DETAILED DESCRIPTION OF THE PRESENT INVENTION

Figure 1:
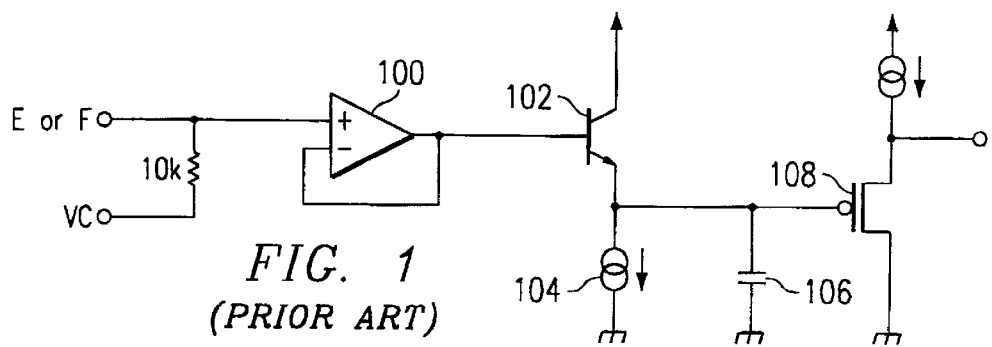
FIG. 1 illustrates a peak hold detector.
Figure 2:
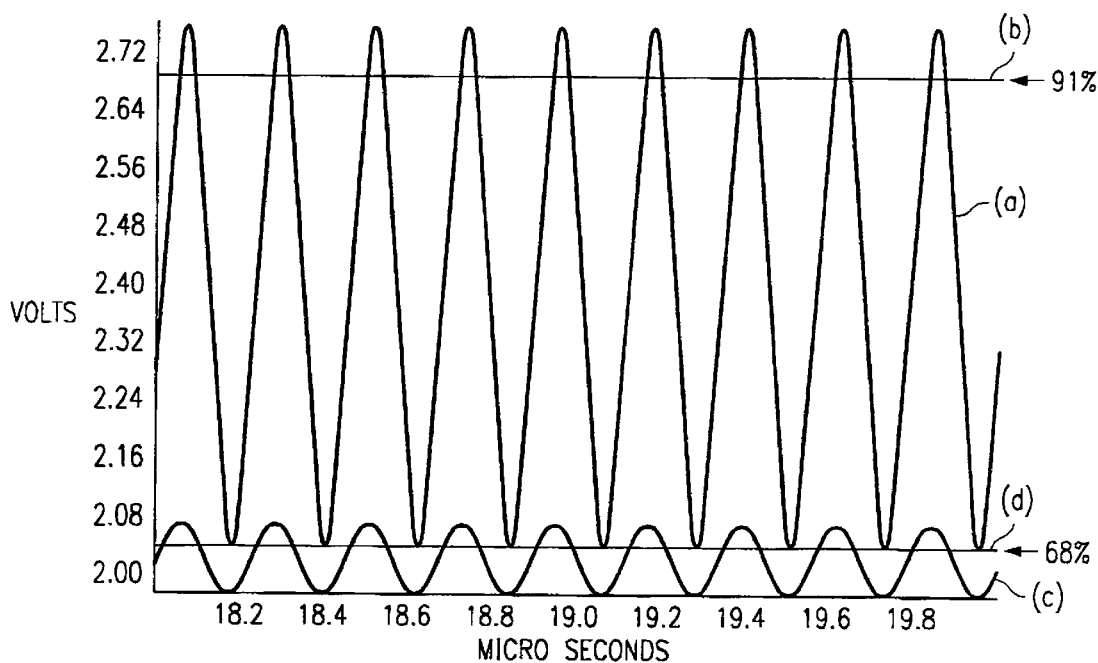
FIG. 2 illustrates the peak voltage associated with that peak detector.
Figure 3:
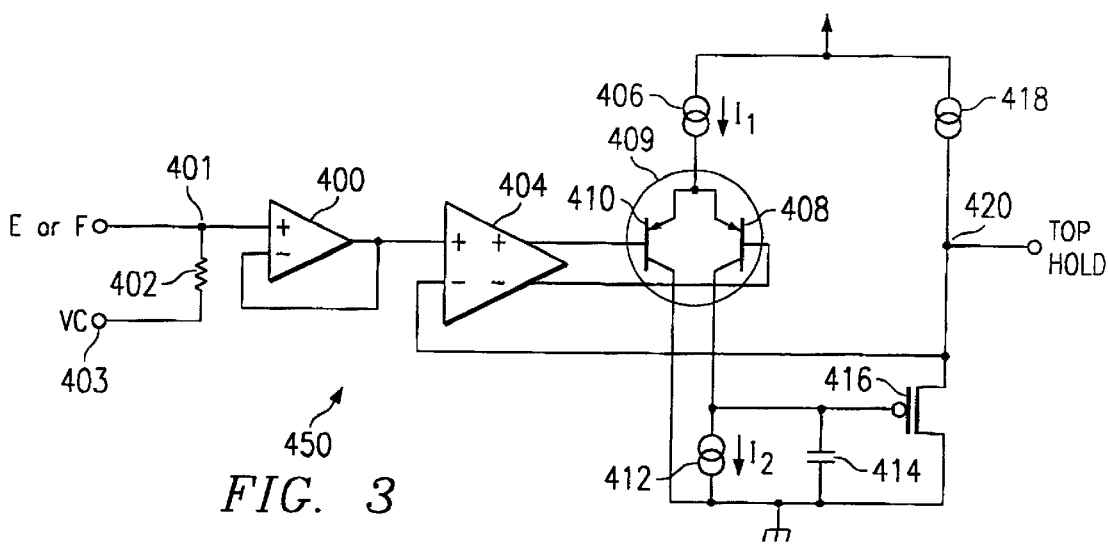
FIG. 3 illustrates a peak detector of the present invention.

The peak detector 450 as illustrated in FIG. 3 includes a resistor 402 connected between an input terminal 401 to receive the input signal and a common voltage $V_C$ and another input terminal 403 to receive the common voltage. The input signal is inputted to terminal 401. Resistor 402 is between terminal 401 and terminal 403. The input signal is inputted to op-amp 400. More particularly, the input signal is inputted to the "plus" input of the op-amp 400. The output of the op-amp 400 is connected to the "negative" input of the op-amp 400. The op-amp 400 functions as voltage follower. The output of the op-amp 400 is connected to a differential comparator 404.

The output of the op-amp 400 is connected to the "plus" input of the differential comparator 404. Additionally, the output terminal of the peak detector 450 is connected to the "minus" input of the differential comparator 404. Additionally, the peak detector 450 includes two current paths. A first current path is through pnp type transistor 410, and a second current path is through the emitter and collector of pnp type transistor 408. The plus output of differential comparator 404 is connected to the base of transistor 410, and the negative output of comparator 404 is connected to the base of transistor 408. The differential comparator 404 produces an output as a difference signal whenever a new peak is received. Divert circuit 409 includes the pair of transistors 410 and 408, which act to divert current either from the first path or from the second path in accordance with the output of differential comparator 404. The pnp type transistors are typically on with no voltage being applied to their base and consequently these pnp type transistors do not have a threshold to overcome the turn on voltage of these devices. When no new peak has been received, transistor 410 is turned on, and transistor 408 is turned off. However, when a new peak has been received the voltage at the base of 408 goes to zero and correspondingly, transistor 408 conducts and transistor 410 does not. The current from current source 406 flows through the second current path through current source 412 and through capacitor 414 raising the voltage on capacitor 414 to raise the gate of FET 416 to the new peak voltage.

The emitters of transistors 410 and 408 are connected to current source 406. The other end of current source 406 is connected to voltage $V_{cc}$. The collector of transistor 410 is connected to ground while the collector of transistor 408 is connected to capacitor 414 and to current source 412. Additionally, the collector of transistor 408 is connected to the gate of PFET 416. The source of PFET 416 is connected to the output terminal of the peak detector 450. The drain of PFET 416 is connected to ground. The output terminal 420 of peak detector 450 is connected to current source 418 and the other end of current source 418 is connected to the voltage $V_{cc}$.

As the op-amp 400 functions as voltage follower, the same voltage with the input signal inputted to the input terminal 401 is substantially provided to the plus input terminal of the differential comparator 404. The differential comparator 404 compares the input signal with the output signal of the peak detector 450 and outputs two transistor control signals (ECL level signals) in accordance with its comparison results. When the input signal is lower than the output signal, the differential comparator 404 outputs low voltage signal and high voltage signal to the bases of the pair of transistors 410 and 408 respectively. Therefore, the transistor 410 is turned on and the transistor 408 is turned off at this time. On the other hand, the differential comparator 404 outputs high voltage signal and low voltage signal to the bases of the pair of transistors 410 and 408 respectively when the input signal is higher than the output signal. At this time, the transistor 410 is turned off and the transistor 408 is turned on.

The current source 406 provides constant current $I_1$, and the current source 412 provides constant current $I_2$. The current source 418 provides constant current to the PFET 416. When the transistor 408 is on-state, the capacitor 414 is charged by the current $(I_1-I_2)$. On the other hand, the capacitor 414 is discharged by the constant current $I_2$ when the transistor 408 is off-state. When the transistor 410 is on-state, the constant current I1 of the current source 406 flows through the emitter and collector of the transistor 410. When the transistor 408 is off-state, the hold voltage at the capacitor 414 decreases by time constant composed of the constant current $I_2$ and capacitance of the capacitor 414. The PFET 416 functions as source follower type buffering circuit and outputs voltage to the output terminal 420 in accordance with its gate voltage provided by the capacitor 414. This output voltage of the PFET 416 at the output terminal 420 is the peak hold voltage of the peak detector 450. The buffering circuit composed of the PFET 416 is implemented by other type of buffer circuit such as voltage follower.

As explained in above, the differential comparator 404 controls current flow of the divert circuit 409 composed of the pair of transistor 410 and 408 to equalize the output signal to the peak of the input signal. In other words, the peak detector 450 controls charge current by high speed ON/OFF of emitter coupled transistors 408, 410 using ECL output comparator 404. Therefore, it is possible to hold the accurate peak (top) voltage of the input signal.

Figure 4:
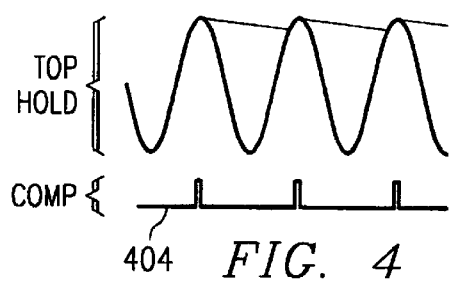
FIG. 4 illustrates the output of the circuit of FIG. 3 and the output of the comparator.

FIG. 4 illustrates the top hold voltage out of the output terminal of peak detector 450 and additionally the outpulses from comparator 404.

Figure 5:
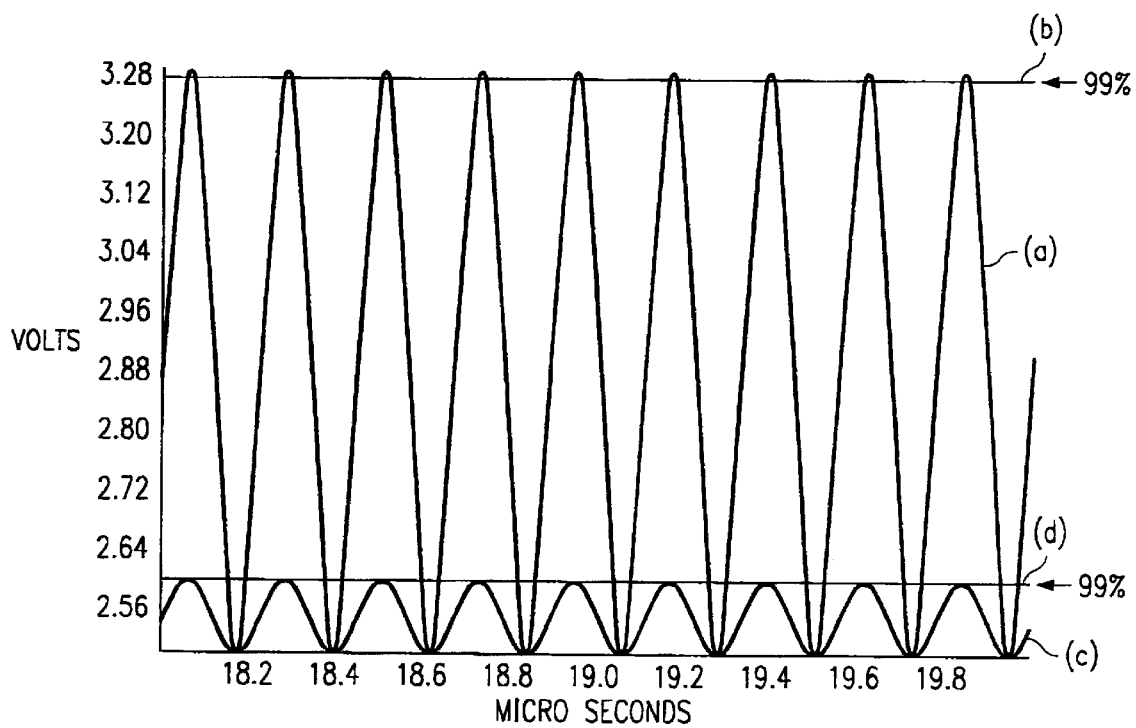
FIG. 5 illustrates the output waveform of the present invention.

FIG. 5 illustrates simulated waveforms of the present invention, that is, the input signals and the top hold voltages. In FIG. 5, (a) is an input signal having 780 mV peak-to-peak amplitude, (b) is a top hold voltage of the input signal (a), (c) is an input signal having 100 mV peak-to-peak amplitude, and (d) is a top hold voltage of the input signal (c). The voltage of the signal (b) is about $99/100$(percent) of the peak voltage of the signal (a), and the voltage of the signal (d) is $99/100$(percent) of the peak voltage of the signal (c).

Figure 6:
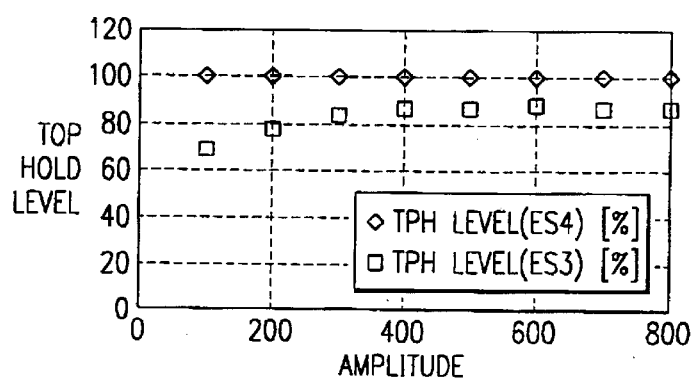
FIG. 6 illustrates simulation results of the relationship between hold peak level to amplitude of the prior art and the present invention.

FIG. 6 illustrates simulation results of the relationship between hold peak level to amplitude of the prior art and the present invention. As shown in FIG. 6, the hold peak level of the present invention is about 100 percent of the input signal and does not depends on the peak-to-peak amplitude of the input signal. On the other hand, the hold peak level of the prior art circuit is lower than the peak voltage of the input signal and depends on the peak-to-peak amplitude of the input signal.

Figure 7:
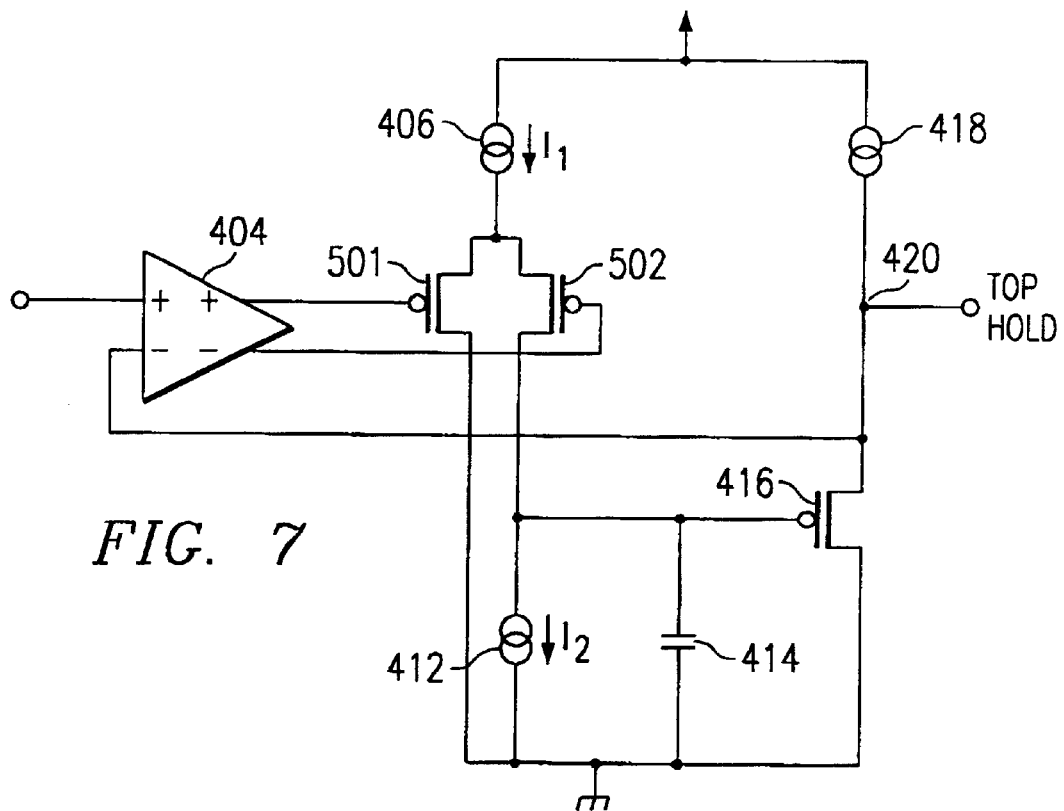
FIG. 7 illustrates another embodiment of a peak detector of the present invention.

FIG. 7 illustrates another embodiment of the peak detector of the present invention. This peak detector is modification circuit of the peak detector 450 shown in FIG. 3, and the pair of pnp type transistors 410, 408 of the peak detector 450 are changed to the pair of PFETs 501, 502. The operation of this peak detector is the same with the peak detector 450.

Figure 8:
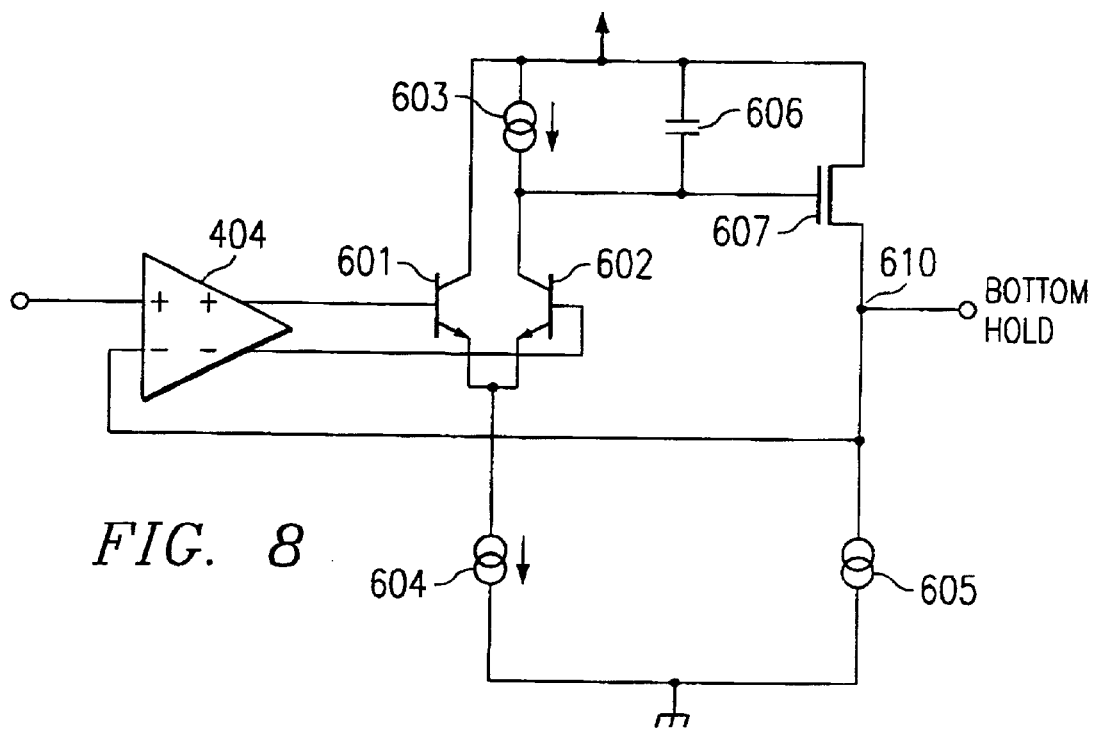
FIG. 8 illustrates another embodiment of a bottom detector of the present invention.
Figure 9:
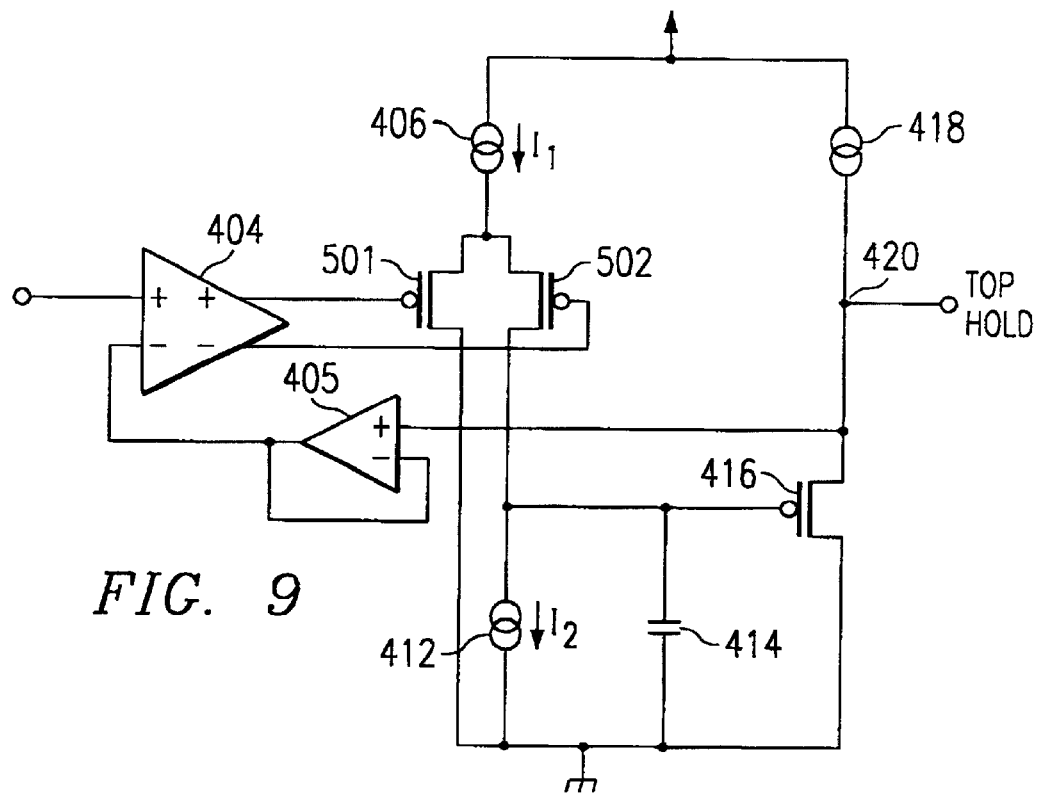
FIG. 9 illustrates a circuit diagram of the present invention.
Figure 10:
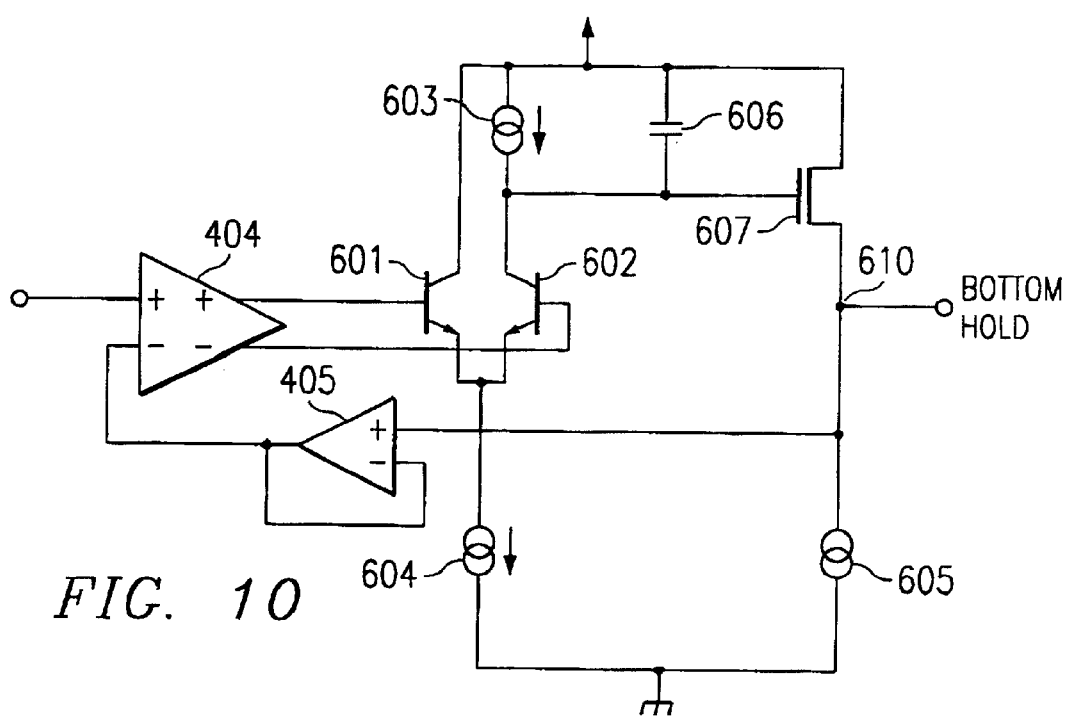
FIG. 10 illustrates a circuit diagram of the present invention.

FIG. 8 illustrates other embodiment of the present invention, and this circuit is a bottom detector. The bottom detector detects bottom voltage of the input signal inputted to "plus" input terminal of differential comparator 404 and provides bottom voltage of the input signal at an output terminal 610. The bottom detector includes the pair of npn type transistors 601, 602 for two current paths. A first current path is through the npn transistor 601, and a second current path is through the emitter and collector of the transistor 602. The "plus" output terminal of the differential comparator 404 is connected to base of the transistor 601, and the "minus" output terminal of the differential comparator 404 is connected to base of the transistor 602. Emitters of the pair of transistors 601, 602 are connected to current source 604, and the other end of the current source 604 is connected to ground. Additionally, collector of the transistor 601 is connected to power source voltage $V_{cc}$, and collector of the transistor 602 is connected to current source 603, to capacitor 606 and to gate of NFET 607. The other end of the current source 603, the other end of the capacitor 606 and drain of the NFET 607 are connected to the voltage $V_{cc}$ respectively. Additionally, source of the NFET 607 is connected to an output terminal 610 and to current source 605, and the other end of the current source 605 is connected to the ground. The output terminal 610 is connected to the "minus" input terminal of the differential comparator.

The differential comparator 404 compares the input signal inputted to the "plus" input terminal with the output signal of the bottom detector inputted to the "minus" input terminal and provides control signals to the bases of the pair of transistors 601, 602 in accordance with its comparison result. When the input signal is lower than the output signal, the differential comparator 404 outputs low voltage signal and high voltage signal to the bases of the pair of transistors 601 and 602 respectively. At this time, the transistor 601 is turned off, and the transistor 602 is turned on. On the other hand, the differential comparator 404 outputs high voltage signal and low voltage signal to the bases of the pair of transistors 601 and 602 when the input signal is higher than the output signal. The transistor 601 is turned on, at this time, the transistor 602 is turned off.

When the transistor 602 is on-state, the capacitor 606 is discharged by current difference between constant current of the current source 604 and constant current of the current source 603 ("constant current 604"–"constant current 603"). On the other hand, the capacitor 606 is charged by the constant current of the current source 603 when the transistor 602 is off-state. When the transistor 601 is on-state, the current flows through the collector and emitter of the transistor 601. The hold voltage of the capacitor 606 increases by time constant composed of the constant current of the current source 603 and capacitance of the capacitor 606. The NFET 607 functions as source follower type buffering circuit and outputs voltage to the output terminal 610 in accordance with its gate voltage provided by the capacitor 606. This output voltage of the NFET 607 at the output terminal 610 is the bottom peak hold voltage of this bottom detector.

In this bottom detector, the pair of npn transistors 601, 602 would be changed to the pair of NFETs respectively.

What is claimed is:

1. A peak detector for detecting a peak signal, comprising:

an input circuit for inputting an input signal;

a differential comparator for comparing the input signal with the peak signal to generate a difference signal;

a diverting circuit to divert current between a first current path and a second current path based on said difference signal;

wherein said first current path including a current source;

wherein said first current path including a current source a comparator to accept said current tom said first current path and not from said second current path and to form said peak signal resulting from said current.

2. A peak detector for detecting a peak signal as in claim 1, wherein said diverting circuit includes a pair of transistors.

3. A peak detector for detecting a peak signal as in claim 2, wherein said pair of transistors are pnp type transistors.

* * * * *